United States Patent [19]
Neely

[11] Patent Number: 4,467,223
[45] Date of Patent: Aug. 21, 1984

[54] ENABLE GATE FOR 3 STATE CIRCUITS
[75] Inventor: Eric D. Neely, Phoenix, Ariz.
[73] Assignee: Motorola, Inc., Schaumburg, Ill.
[21] Appl. No.: 370,706
[22] Filed: Apr. 22, 1982
[51] Int. Cl.³ .................... H03K 17/60; H03K 19/088
[52] U.S. Cl. .................................. 307/254; 307/456; 307/473
[58] Field of Search ............... 307/254, 270, 443, 473, 307/456–458, 255

[56] References Cited
U.S. PATENT DOCUMENTS

| 3,510,685 | 5/1970 | Watanabe et al. | 307/457 X |
| 3,736,572 | 5/1973 | Tu | 307/473 X |
| 4,042,840 | 8/1977 | Chan | 307/473 X |
| 4,251,737 | 2/1981 | Gaudenzi | 307/473 |
| 4,322,640 | 3/1982 | Fukushima et al. | 307/456 X |
| 4,413,194 | 11/1983 | Birch | 307/456 |

Primary Examiner—Larry N. Anagnos
Attorney, Agent, or Firm—William E. Koch

[57] ABSTRACT

A circuit for providing a signal which enables the high impedance state of a subsequent three state circuit includes a first circuit portion which provides current to an output node to disable the high impedance state when an input signal is in the first state and a second circuit portion which sinks current from the output node to enable the high impedance state when the input signal is in a second state. The circuit includes an input stage which is directly coupled to a transistor, which transistor simultaneously enables said second circuit portion and disables said first circuit portion when the input signal switches from said second state to said first state.

10 Claims, 1 Drawing Figure

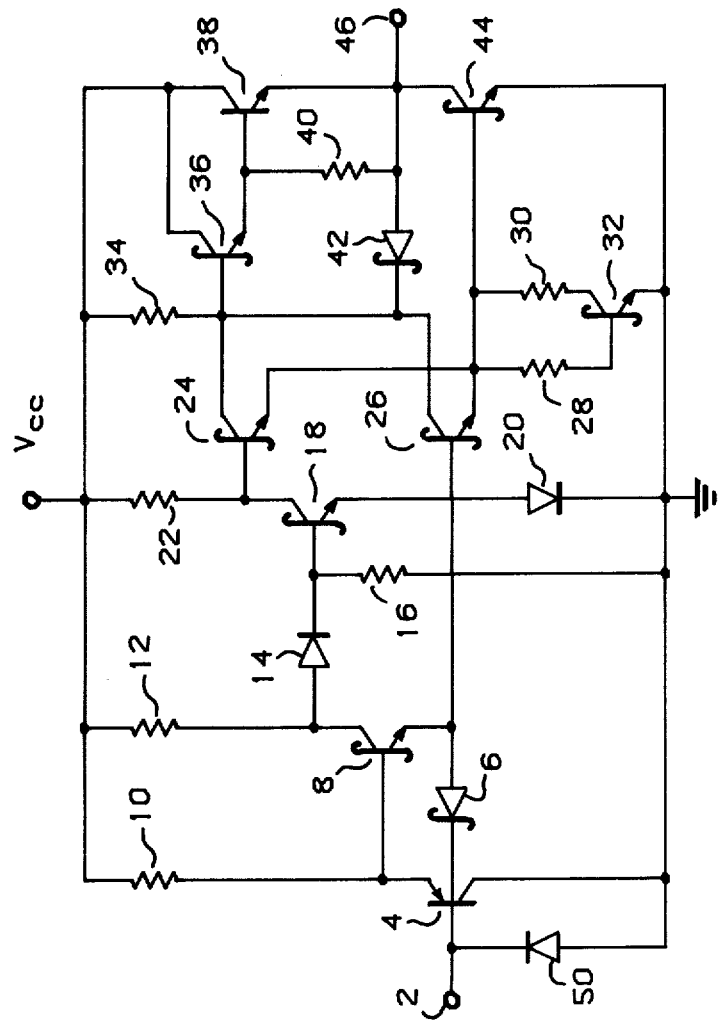

ENABLE GATE FOR 3 STATE CIRCUITS

BACKGROUND OF THE INVENTION

This invention relates generally to a circuit for driving three-state circuitry, which circuit includes delay means for ensuring that the time it takes to enable the high impedance state of the three state circuitry is shorter than the time it takes to disable the high impedance state. More particularly, the invention relates to a circuit for driving three state circuitry including means coupled to the output stage of the enabling circuitry and to a point within the circuit prior to the delay means for increasing the output transition speed when the circuit switches from a disabling mode to an enabling mode, without requiring output current limiting.

Three state circuits are well known and are capable of assuming three stable conditions; i.e. active high, active low, and high impedance. In circuits such as memory address multiplexes employing three state circuits, operation is enhanced if the time it takes the driver circuits to switch from a disabling mode; (i.e. one in which a three state circuit may assume an active high or an active low output) to an enabling mode (i.e. that which places the three state circuit in its high impedance state) is shorter than the transition time from an enabling mode to a disabling mode.

One known driver circuit for accomplishing the above may be represented by first and second paths each containing an inverter with the first path also containing an extra gate delay. Both the inputs and the outputs of the first and second paths are coupled together. As a result of the extra gate delay in the first path, the inverter in the second path will achieve a low output level while the first path will attempt to maintain a high level when the input first switches from a low level to a high level. This is accomplished in the known circuit by turning on a transistor which sinks that output current when the input switches from a low to a high level. To allow this transistor to realize its on state, however, a resistor is placed between the output and a source of supply voltage which limits the current flowing through the transistor. Unfortunately, this resistor also limits the output current which reduces the circuits ability to drive highly capacitive loads.

SUMMARY OF THE INVENTION

It is an object of the present invention to provide an improved enable gate for driving three state circuits.

It is a further object of the present invention to provide an enable gate for three state circuits having improved output transition speed without limiting current so as to maintain the circuits ability to drive capacitive loads.

According to a broad aspect of the invention there is provided a circuit for providing an enabling signal at an output thereof when an input signal is in a first state and for providing a disabling signal at said output when said input signal is in a second state, comprising: first means for supplying current to said output when said input signal is in said second state to produce said disabling signal; second means for sinking current from said output when said input signal is in said first state to produce said enabling signal; an input stage for receiving said input signal; third means coupled to said first means for enabling said first means when said input signal is in said second state and for disabling said first means and enabling said second means which said input signal is in said first state; delay means coupled between said input stage and said third means; and fourth means coupled to said second means for disabling said second means when said input signal is in said second state and for enabling said second means and disabling said first means when said input signal is in said first state, said fourth means being coupled directly to said input stage.

BRIEF DESCRIPTION OF THE DRAWINGS

The above and other objects, features and advantages of the present invention will be more clearly understood from the following detailed description taken in conjunction with accompanying drawing which is a schematic diagram of the inventive enable gate.

DESCRIPTION OF THE PREFERRED EMBODIMENT

The inventive circuit shown in the drawing includes an input stage, a delay stage, a control stage including bypass circuitry, an output stage, and bias resistors 10, 12, 22, and 34.

The input stage includes PNP transistor 4, Schottky transistor 8, Schottky diode 6, and Schottky diode 50. The base of transistor 4 is coupled to input terminal 2 and to the anode of diode 6. The emitter of transistor 4 and the collector of transistor 8 are coupled to a source of supply voltage $V_{CC}$ via respectively bias resistors 10 and 12. The collector of transistor 4 is coupled to ground, and the emitter of transistor 8 is coupled to the anode diode 6. Schottky diode 50 merely assures that the voltage at terminal 2 does not fall significantly below ground.

The delay stage includes diodes 14 and 20, resistor 16 and Schottky transistor 18. It is diodes 14 and 20 and transistor 18 which provides the proper skew between the enable and disable times described above. The anode of diode 14 is coupled to the collector of transistor 8 and its cathode is coupled to ground via resistor 16 and to the base of Schottky transistor 18. The emitter of transistor 18 is coupled via diode 20 to ground, and its collector is coupled via bias resistor 22 to $V_{CC}$. The circuits control stage includes Schottky transistors 24 and 26 and a bypass circuit including resistors 28 and 30 and Schottky transistor 32. This bypass circuit is described in detail in U.S. Pat. No. 27,804 entitled "Transistor Transistor Logic Circuits Having Improved Voltage Transfer Characteristic" and assigned to assignee of the present invention, the teachings of which are hereby incorporated by reference.

The base of transistor 24 is driven by the collector of transistor 18 and its emitter is coupled to the emitter of transistor 26 and to the bypass circuit. The base of transistor 26 is coupled to and driven by the emitter of transistor 8 and has a collector which is coupled to the collector of transistor 24 and, via bias resistor 34, to $V_{CC}$.

The output stage includes Schottky transistors 36 and 44, and NPN transistor 38, resistor 40 and Schottky diode 42. Transistor 36 is driven by the collectors of transistors 24 and 26 and in turn drives transistor 38 which has a collector coupled to $V_{CC}$ and an emitter coupled to output terminal 46. A resistor 40 is coupled between the base of transistor 38 and the anode of diode 42. The cathode of diode 42 is coupled to the junctions of the collectors of transistors 24 and 26. Diode 42 provides a means for coupling charges from the load at terminal 46 into the base of 44 for faster turn on of transistor 44. Resistor 40 in conjunction with diode 42 provides a path for removing charge from the base of transistor 38. Similarly, resistor 16 in the delay stage provides a path for removing charge from the base of transistor 18 while diode 6 assists in removing charge from the base of transistor 26. Transistor 44 has an emitter coupled to ground, a collector coupled to output terminal 46 and a base coupled to the emitter of transistor 26 and to the bypass circuitry described above.

The circuit is disabled (i.e. allows a subsequent three state circuit to assume either an active high or an active low state) when a low or logical zero voltage is present at input terminal 2 causing a high or logical one voltage to appear at terminal 46. This is accomplished as follows. When a low voltage appearing at terminal 2, transistor 4 is rendered conductive. This removes base drive from transistor 8 maintaining it nonconductive. Thus, transistor 18 is turned on causing base drive to be diverted away from transistor 24. This renders transistor 24 nonconductive and turns on transistor 36 which in turn supplies base drive to transistor 38 turning it on. Since transistor 8 is maintained off, insufficient base drive is supplied to transistor 26. With both transistors 24 and 26 off, transistor 44 is maintained nonconductive and thus the voltage at output terminal 46 will rise to a high level.

If it were now desired to place a three state gate which is coupled to output terminal 46 in its high impedance state, the voltage at terminal 2 switches from a low level to a high level. Transistor 4 is thus rendered nonconductive causing base drive to be supplied to transistor 8 turning it on. As soon as transistor 8 becomes conductive, base drive is supplied to transistor 26 turning it on. In this manner, base drive is diverted from the base of transistor 36 through transistor 26. As a result, transistor 36 turns off which in turn renders transistor 38 nonconductive. In this manner, transistor 38 is rendered nonconductive without waiting for the switching action at input terminal 2 to propagate through the delay stage. With transistor 8 on, transistor 24 is rendered conductive after a delay through diode 14 and transistor 18. The conductive state of transistor 24 now provides a second means of diverting base drive from transistor 36 maintaining transistor 38 off. Furthermore, when transistor 26 was turned on, base drive was supplied to transistor 44 turning it on. Through the action of transistor 38 turning off and transistor 44 turning on, the voltage at output terminal 46 will go low thus enabling the high impedance state of the subsequent three state gate or gates. Stated another way, the delay in turning off transistor 38 when the input voltage switches from a low level to a high level has been avoided without current limiting the output current as was present in the prior art circuit.

The above description is given by way of example only. Changes in form and details may be made by one skilled in the art without departing from the scope of the invention. For example, while certain of the elements have been shown as being of the Schottky type, these elements may be replaced with conventional elements.

I claim:

1. A circuit for providing an enabling signal at an output thereof when an input signal is in a first state and for providing a disabling signal at said output when said input signal is in a second state, comprising:

first means for supplying current to said output when said input signal is in said first state to produce said enabling signal;

second means for sinking current from said output when said input signal is in said second state to produce said disabling signal;

an input stage for receiving said input signal;

third means coupled to said first means for enabling said first means when said input signal is in said first state and for disabling said first means and enabling said second means when said input signal is in said second state;

delay means coupled between said input stage and said third means; and fourth means coupled to said second means for disabling said second means when said input signal is in said first state and for enabling said second means and disabling said first means when said input signal is in said second state, said fourth means being coupled directly to said input stage.

2. A circuit according to claim 1 wherein said first means includes a first transistor circuit means having a collector for coupling to a source of supply voltage, a base coupled to said third means, and an emitter coupled to said output.

3. A circuit according to claim 2 wherein said second means includes second transistor circuit means having a base coupled to said fourth means, a collector coupled to said output and an emitter for coupling to a second source of supply voltage.

4. A circuit according to claim 3 wherein said third means includes third transistor circuit means having a base coupled to said delay means, a collector coupled to the base of said first transistor circuit means and for coupling to said first source of supply voltage, and an emitter coupled to the base of said second transistor circuit means.

5. A circuit according to claim 4 wherein said fourth means comprises fourth transistor circuit means having an emitter coupled to the base of said second transistor circuit means, a collector coupled to the base of said first transistor circuit means, and a base coupled to said input stage.

6. An inverter circuit having an input stage and an output, comprising:

first means for supplying current to said output when said input is at a first potential;

second means for sinking current from said output when said input is at a second potential;

third means coupled to said first means for enabling said first means when said input is at said first potential and for disabling said first means when said input is at said second potential;

delay means coupled between said input stage and said third means; and fourth means coupled to said second means for disabling said second means when said input is at said first potential and for enabling said second means and disabling said first means when said input is at said second potential, said fourth means being coupled directly to said input stage.

7. A circuit according to claim 6 wherein said first means includes first transistor circuit means having a collector for coupling to a source of supply voltage, a base coupled to said third means, and an emitter coupled to said output.

8. A circuit according to claim 7 wherein said second means includes second transistor circuit means having a base coupled to said fourth means, a collector coupled to said output and an emitter for coupling to a second source of supply voltage.

9. A circuit according to claim 8 wherein said third means includes third transistor circuit means having a base coupled to said delay means, a collector coupled to the base of said first transistor circuit means and for coupling to said first source of supply voltage, and an emitter coupled to the base of said second transistor circuit means.

10. A circuit according to claim 9 wherein said fourth means comprises fourth transistor circuit means having an emitter coupled to the base of said second transistor circuit means, a collector coupled to the base of said first transistor circuit means, and a base coupled to said input stage.

* * * * *